United States Patent
Borsch et al.

(10) Patent No.: US 7,889,512 B1
(45) Date of Patent: Feb. 15, 2011

(54) MID-BUS CONNECTION TO TRACES ON A PRINTED CIRCUIT BOARD

(75) Inventors: Michael J. Borsch, Austin, TX (US);
Steven R. Klassen, Austin, TX (US);
Sanjiv Lakhanpal, Austin, TX (US)

(73) Assignee: Advanced Micro Devices, Inc., Sunnyale, CA (US)

( * ) Notice: Subject to any disclaimer, the term of this patent is extended or adjusted under 35 U.S.C. 154(b) by 1473 days.

(21) Appl. No.: 10/269,533

(22) Filed: Oct. 11, 2002

(51) Int. Cl.
*H01R 9/00* (2006.01)

(52) U.S. Cl. .............. 361/775; 361/763; 361/764; 361/803

(58) Field of Classification Search ......... 361/760–764, 361/767, 775; 439/55; 365/200
See application file for complete search history.

(56) References Cited

U.S. PATENT DOCUMENTS

| | | | | |
|---|---|---|---|---|
| 5,119,020 A | * | 6/1992 | Massey et al. | 324/754 |
| 5,224,021 A | * | 6/1993 | Takada et al. | 361/774 |
| 5,768,109 A | * | 6/1998 | Gulick et al. | 361/794 |
| 6,128,685 A | * | 10/2000 | Cronin | 710/301 |
| 6,456,502 B1 | * | 9/2002 | Miller et al. | 361/760 |
| 6,502,221 B1 | * | 12/2002 | Vogel et al. | 716/1 |
| 6,515,501 B2 | * | 2/2003 | Bosnyak et al. | 326/30 |
| 6,593,840 B2 | * | 7/2003 | Morrison et al. | 336/192 |

OTHER PUBLICATIONS

"HyperTransport™ I/O Link Specification," HyperTransport Technology Consortium, Revision 1.03, Oct. 10, 2001, pp. 1-217.
"HyperTransport™ Technology I/O Link," Advanced Micro Devices, Inc., Jul. 20, 2001, pp. 1-25.
"HyperTransport™ Technology: Simplifying System Design," Advanced Micro Devices, Inc., Oct. 2002, pp. 1-22.

* cited by examiner

*Primary Examiner*—Tuan T Dinh
(74) *Attorney, Agent, or Firm*—Zagorin O'Brien Graham LLP

(57) ABSTRACT

A technique for observing signaling on the traces between ICs on a PC board without introducing significant signal degradation is provided. A route-through connector footprint allows the use of a standard connector without the use of stub traces. The route-through connector footprint allows a standard connector to be introduced directly into the line traces routed between ICs. Because stub traces are not used, this technique for mechanical interconnection into the line traces on a PC board allows for a single board layout to be used for both test and production. Additionally, because stub traces are not used, signal quality is minimally impacted and testing can be performed at operational speeds improving the reliability of the test function. The use of a route-through connector footprint additionally saves PC board space and cost.

24 Claims, 8 Drawing Sheets

MID-BUS CONNECTION TO TRACES ON A PRINTED CIRCUIT BOARD

BACKGROUND

1. Field of the Invention

This invention relates to printed circuit boards and more particularly to the placement and connection of a connector with respect to line traces.

2. Description of the Related Art

Packaged integrated circuits (ICs) are commonly interconnected on printed circuit boards (PC boards or PCBs) by layers of conductors (commonly referred to as line traces). Each line trace carries signaling between ICs. A line trace can interconnect multiple devices or make a point to point connection between two ICs. Modern PC boards can have as many as 20-24 layers of line traces with pitch spacings as small as 4 MILs. However, in the personal computer industry, cost and other restrictions keep the number of layers on the main PC board at four. As technology progresses, the signal transfer rate between ICs over these line traces increases. Additionally, the signaling voltage decreases with improvements in technology. High-speed, low-voltage signaling requires strict adherence to routing rules, for example, maximum routing lengths of line traces and maximum trace widths, to ensure signal quality.

To test or debug a PC board system including integrated circuits, the signaling on line traces of the PC board is observed. Often, stub traces are formed off of the line traces and routed to a connector, typically near the edge of the board, to provide visibility. A logic analysis tool can be attached to the traces via the connector, providing a testing platform. A stub trace can change the electrical characteristics of the line trace, decreasing the signal quality. For example, the stub trace can cause effects such as reflections or dispersions. For typical applications that have a bus speed less than 50 MHz, stub traces routed to a connector have not been a problem. For complex applications that have high-speed and/or low-voltage signaling, the addition of a stub trace can require the system to be tested at slower than operational speeds. For example, the HyperTransport bus which has bus speeds from 200 to 800 MHz cannot have stub lengths greater than ½ inch. Anything greater will cause errors in the signaling. Thus, testing results for complex applications are less reliable.

Because connectors are expensive and trace stubs affect signal integrity, separate boards for test and production are typically manufactured. Often, the production board has a different layout than the test board. Because two types of boards are made, the system cost is increased. Additionally, because there might be some electrical inconsistencies between the test and production boards, the reliability of the testing function is decreased.

A new technique for observing signaling on the traces between ICs on a PC board is needed that enables signals to be transmitted over line traces while encountering limited signal degradation. The present invention addresses these and other problems by providing a technique for mechanical interconnection into the line traces on a PC board without causing significant signal degradation and without increasing system cost.

SUMMARY

A technique for observing signaling on the traces between ICs on a PC board without introducing significant signal degradation is provided. A route-through connector footprint allows the use of a standard connector without the use of stub traces. The route-through connector footprint allows a standard connector to be introduced directly into the line traces routed between ICs. Because stub traces are not used, this technique for mechanical interconnection into the line traces on a PC board allows for a single board layout to be used for both test and production. Additionally, because stub traces are not used, signal quality is minimally impacted and testing can be performed at operational speeds improving the reliability of the test function. The use of a route-through connector footprint additionally saves PC board space and cost.

Accordingly, in one embodiment, a printed circuit board includes a plurality of line traces routed between two integrated circuits and signal pads adjacent and electrically connected to each of the plurality of line traces forming a connector footprint. The signal pads form a route-through connector footprint over the line traces.

In another embodiment, the signal pads are elongated for easier hand soldering of a connector to the printed circuit board.

In another embodiment, signaling on the plurality of line traces can be observed at operational speeds through a connector attached to the signal pads.

In another embodiment, the route-through connector footprint is configured to receive a standard connector having a plurality of leads by connecting less than all of the plurality of leads to the signal pads.

In another embodiment, the route-through connector footprint is configured to allow the plurality of line traces to be routed underneath a connector.

In another embodiment, a method of manufacturing a printed circuit board includes forming plurality of line traces routed between two integrated circuits and forming signal pads adjacent and electrically connected to each of the plurality of line traces forming a connector footprint. The connector footprint is configured to allow the plurality of line traces to be routed underneath a connector.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

These and other features and advantages of the invention will now be described with reference to the drawings summarized above. These drawings and the associated descriptions are provided to illustrate a preferred embodiment of the invention, and not to limit the scope of the invention. Throughout the drawings, reference numbers are re-used to indicate correspondence between referenced elements.

A technique for observing signaling on the traces between ICs on a PC board without introducing significant signal degradation is provided. A route-through connector footprint allows the use of a standard connector without the use of stub traces. The route-through connector footprint allows a standard connector to be introduced directly into the line traces routed between ICs. Because stub traces are not used, this technique for mechanical interconnection into the line traces on a PC board allows for a single board layout to be used for both test and production. Additionally, because stub traces are not used, signal quality is minimally impacted and testing can be performed at operational speeds improving the reliability of the test function. The use of a route-through connector footprint additionally saves PC board space and cost.

The route-through connector footprint can be used for logic analysis during system debug. Additionally, the route-through connector footprint can save PC board space and cost when used for interconnection between ICs on multiple PC boards.

Figure 1:
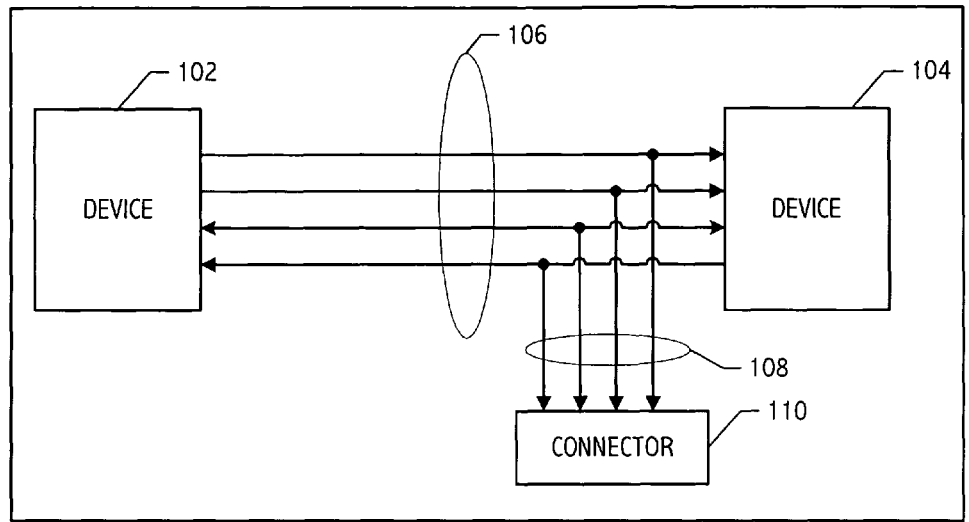
FIG. 1, labeled prior art, illustrates a printed circuit board system with stub traces routed to a connector.

FIG. 1, labeled prior art, illustrates a printed circuit board system with stub traces routed to a connector. A PC board 100 has a first IC device 102 coupled to transmit signals between a second IC device 104 via line traces 106. The ICs depicted could include any of several devices which send or receive signals such as a microprocessor, memory, transceiver, network switch, controller, and the like. To provide observability of the signaling on line traces 106, stub traces 108 are tapped from each of line traces 106 and routed to a connector 110. A logic analyzer can be connected to connector 110 to provide a test function including, for example, display of the signaling activity on the line traces, a trigger capability, and the like. Connector 110 is typically at the edge of PC board 100.

Because stub traces 108 are connected to line traces 106, the communication signals transmitted between ICs 102 and 104 on line traces 106 are degraded due to transmission line effects and dispersion. Thus, to observe the signaling with connector 110, the bus speed is reduced to allow signals to stabilize prior to sampling.

Due to the cost of populating connector 110 and the signal degradation caused by stub traces 108, PC board 100 is typically utilized for test only. Connector 110 and stub traces 108 are removed from PC board 100 to produce production boards. Additionally, PC board 100 may be re-laid out, optimizing the positions of ICs 102 and 104 and the routing of line traces 106.

Figure 2:
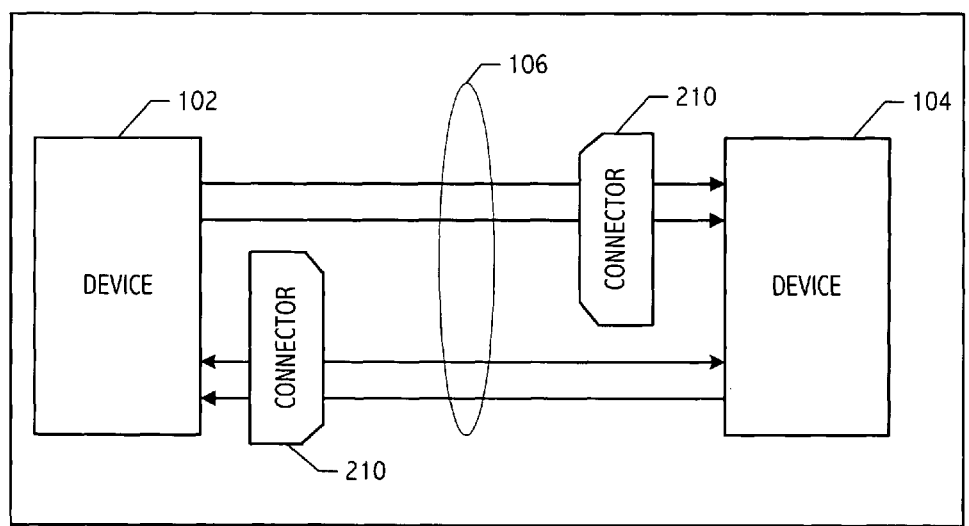
FIG. 2 illustrates a printed circuit board system utilizing a route-through connector footprint according to an embodiment of the present invention.

FIG. 2 illustrates a printed circuit board system utilizing a route-through connector footprint according to an embodiment of the present invention. A PC board 200 has a first IC device 102 coupled transmit signals between a second IC device 104 via line traces 106. The ICs depicted could include any of several devices which send or receive signals such as a microprocessor, memory, transceiver, network switch, controller, etc.

To provide observability of the signaling on line traces 106, one or more connectors 210 are introduced directly into line traces 106 utilizing a route-through connector footprint. Signal pads are formed adjacent to or inline with and electrically connected to line traces 106 to form the route-through connector footprint. Multiple leads on connectors 210 are not connected to form the route-through connector footprint. Thus, line traces can be "routed-through" or underneath the connector, eliminating the need for stub traces. Connectors 210 are preferably surface mounted to minimize the area impact on PC board 200. Additionally, the height of connectors 210 is as small as possible to maintain a stub length of less than ½ inch. The use of a route-through connector footprint allows routing rules to be maintained and fits into a small area, saving board space. A logic analyzer can be connected to connectors 210 to provide testing capability, including display of the signaling activity on the line traces, a trigger capability, and the like.

For buses with strict routing rules, for example, a HyperTransport™ (HT) link implementation that utilizes differential pair signaling, preferably connectors 210 are placed close to the signaling receive side of the line traces but no farther than mid-way between IC devices 102 and 104.

Connectors 210 can be oriented such that the side with corner-cuts is away from IC device 102 or 104 which it is closest to. The connector orientation is most useful when placing the connectors on the traces during the PCB layout process. This suggested orientation identifies which end of the link the landing pattern is to be placed. Corner cuts facing each other are easily identifiable as correct positioning. Corner cuts facing away from each other are easily identifiable as incorrect positioning, in particular, that they are positioned at the wrong end of the links and should be moved to the receive end of the respective links.

Note that line traces 106 as illustrated in FIGS. 1 and 2 are illustrated as straight line trace connections between ICs 102 and 104 for ease of illustration. Actual implementations of line traces 106 can have many different routing patterns, including bends, turns, and the like. Additionally, vias can be used to transfer a line trace from one layer of the PC board to another. Line traces often must adhere to routing restrictions such as a maximum line variation length between one trace and another, for example, a line trace carrying a clock signal and another carrying data. Line traces carrying differential pair signaling have minimum separation widths between the complementary pair signals.

Figure 3A:
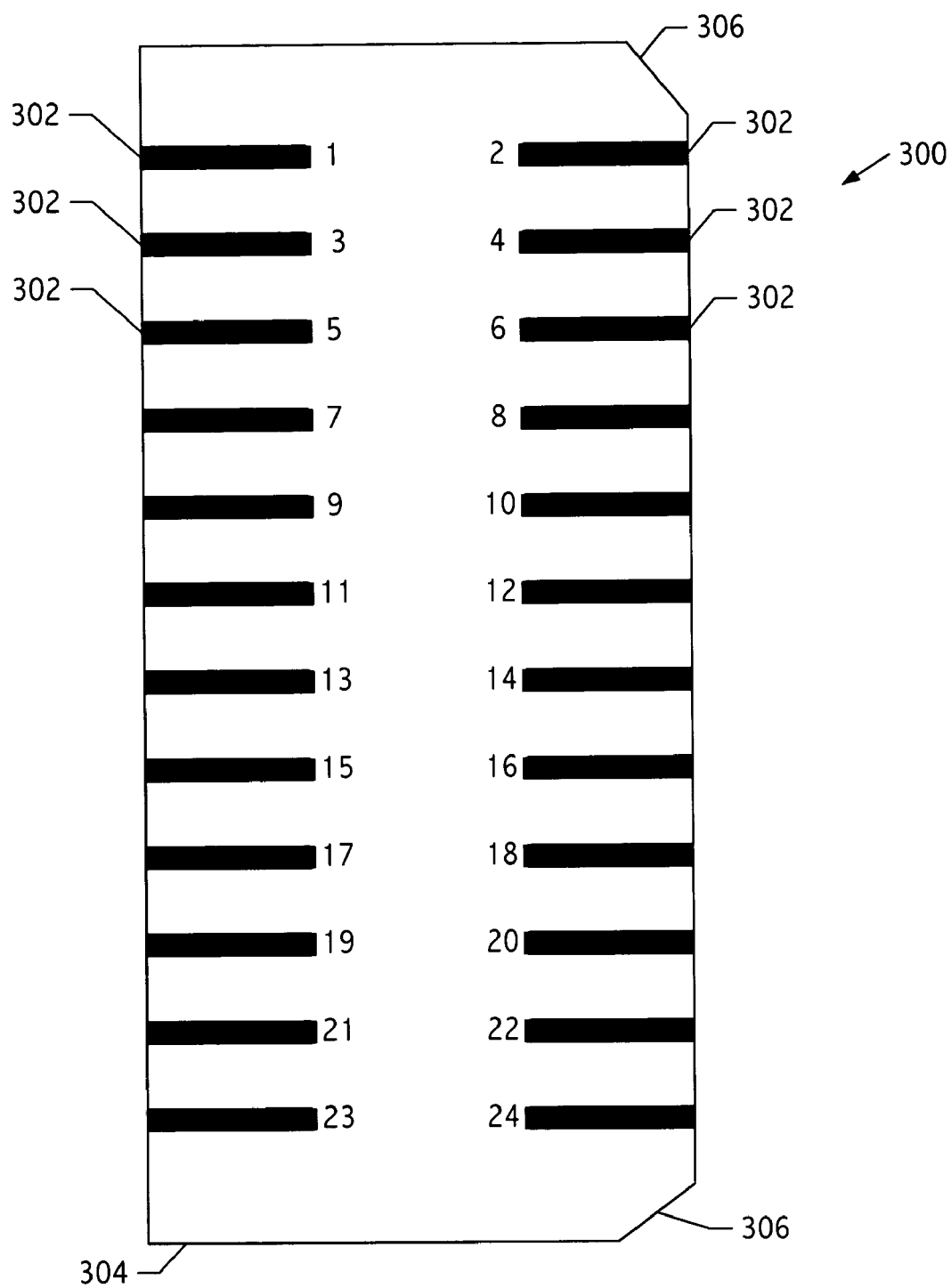
FIGS. 3A-3B, prior art, illustrate standard connector footprints.
Figure 3B:
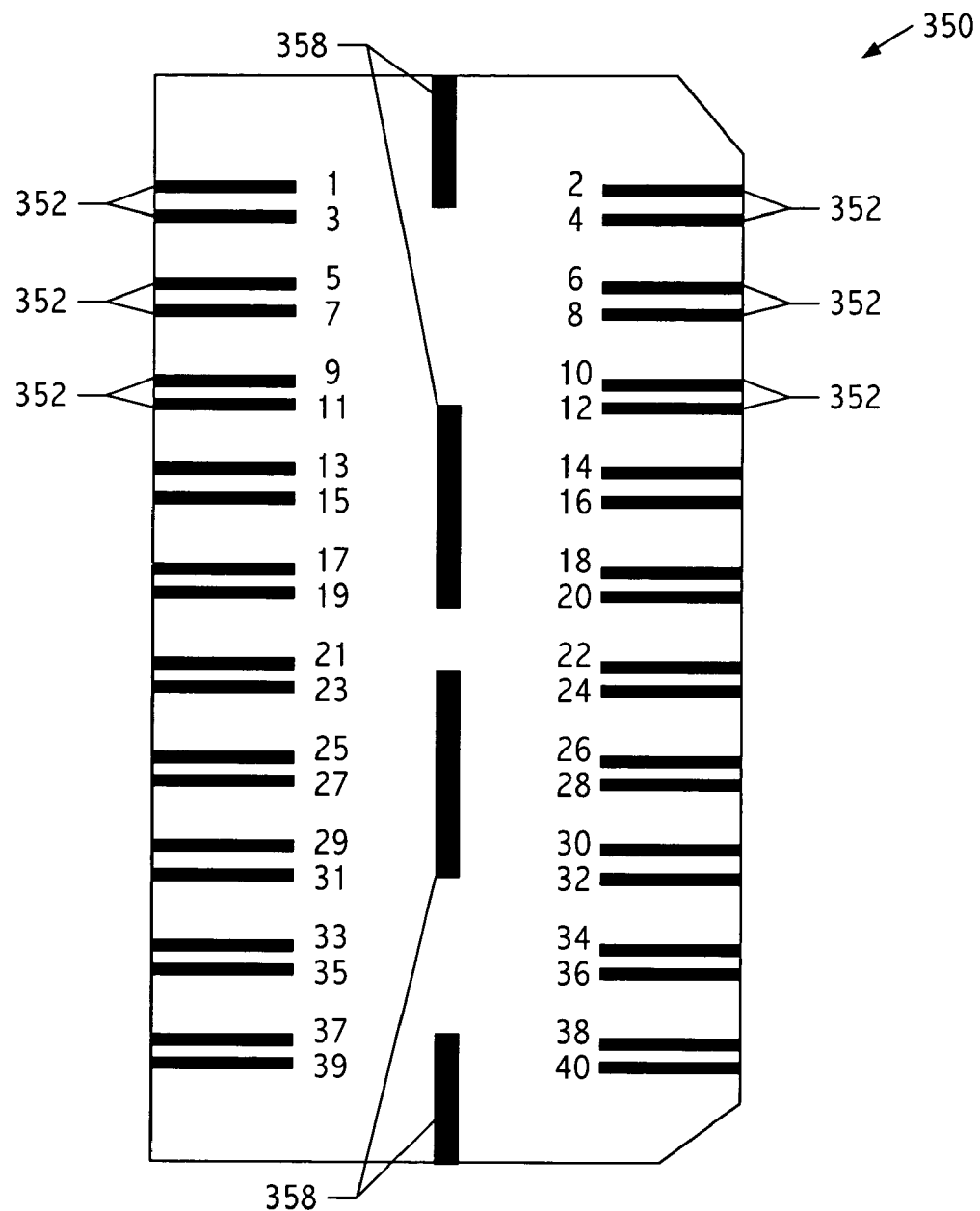

FIGS. 3A-3B, labeled prior art, illustrate two exemplary connector footprints for standard, off-the-shelf connectors. A footprint is a landing pattern for the leads of the connector. Multiple signal pads 302 along two opposing sides corresponding to lead connection points of a connector form a connector footprint 300. Connector footprint 300 is formed on a PC board connected to line traces. The connector is then mounted or attached to the PC board, making contact with the footprint and therefore the line traces. A mating connector, for example, attached to a logic analyzer, can be inserted into the PC board mounted connector for analysis of the PC board and IC devices. Corner cutouts 306 aid in connector orientation and placement.

FIG. 3B illustrates a standard connector footprint for differential pair signaling. Multiple pairs of signal pads 352 along two opposing sides corresponding to lead connection points of a differential pair signaling connector form a connector footprint 350. To maintain the electrical integrity of the differential pair signaling, complementary pair signals must adhere to strict routing rules, for example, a maximum separation of 5 MILS between complementary pair signals. Additionally, signal to signal length matching, that is, the length difference allowed between the longest and the shortest average of the true and complement signals within a clock group must be maintained for differential pair signaling. Thus, to provide observability of differential pair signals, connectors must also adhere to the routing rules. In additional to the signal pads 352, four center ground pads 358 are utilized for ground connection.

Standard off-the-shelf connector footprints can vary widely. For example, any number of signal pads can be provided. Additionally, any number and orientation of ground pads can be provided. Custom connectors differ from standard connectors in that they are customized for particular applications and are often not widely distributed. Standard connectors are cheaper than custom connectors and can be used in a wide variety of applications.

Full implementation of a standard connector footprint does not allow line traces to pass through the landing pattern. Line traces must be specially routed to the connector, requiring separate test boards (those with connectors and stub traces) and production boards (those without connectors or stub traces).

Figure 4A:
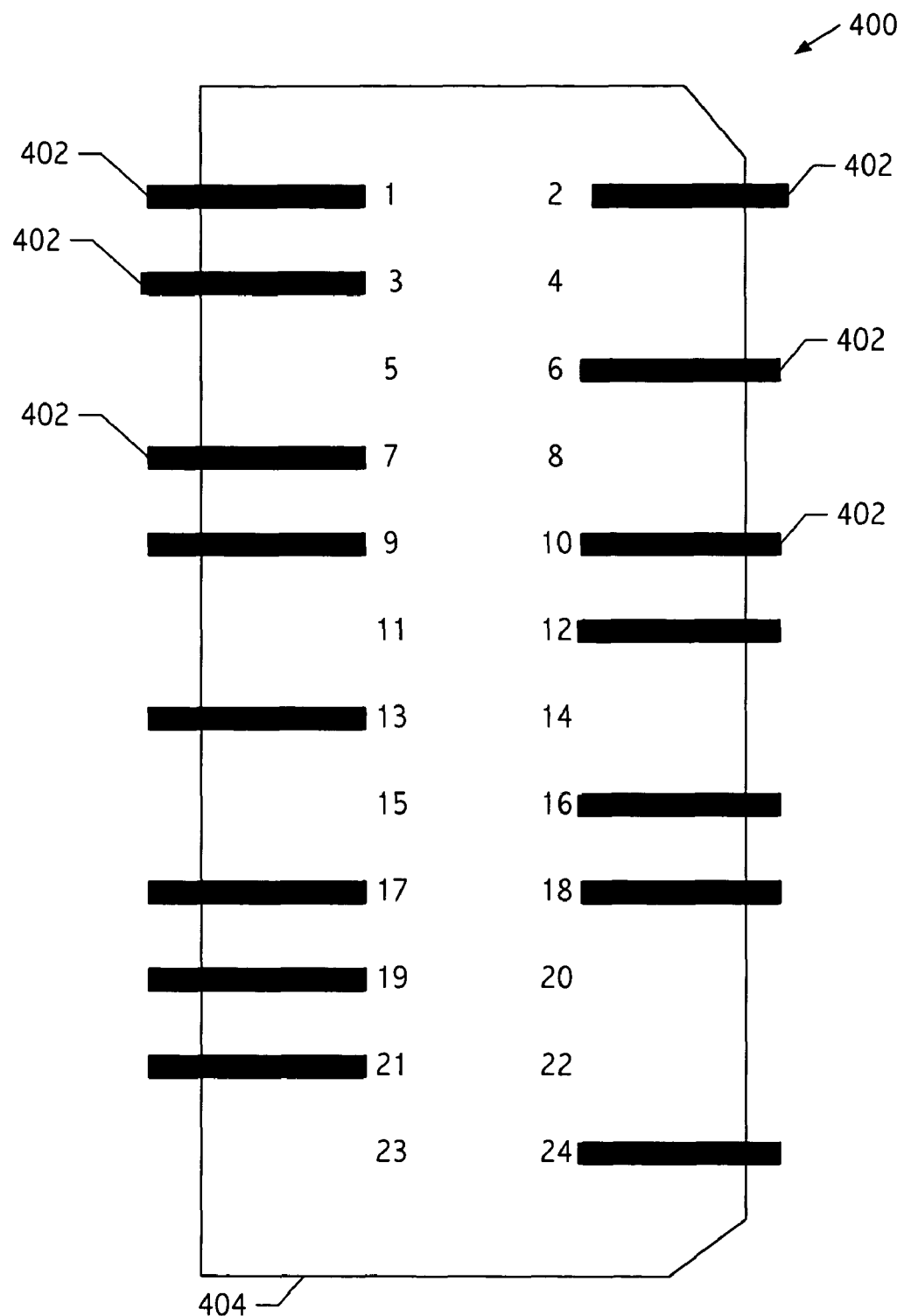
FIGS. 4A-4B illustrate route-through connector footprints according to embodiments of the present invention.
Figure 4B:
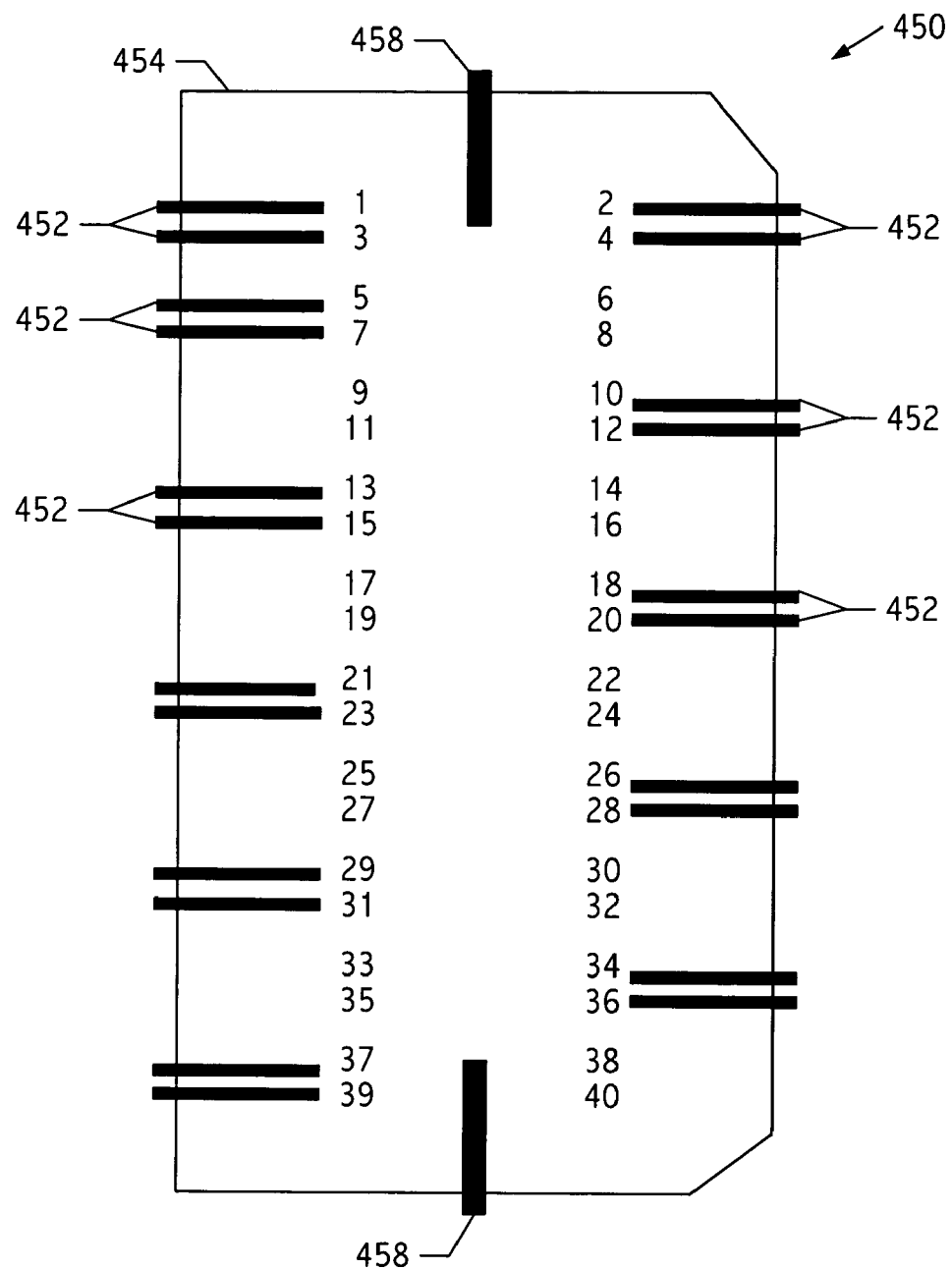

FIGS. 4A-B illustrate route-through connector footprints according to embodiments of the present invention. As illustrated, the connector footprints of standard, off-the-shelf connectors are modified to provide route-through connector footprints. A selected number of signal pads are omitted from the standard connector landing pattern to provide the route-through capability for line traces. Connector leads without signal pads are not connected and not used. Although not all leads are used, the ability to use a standard connector saves cost. A standard connector utilizing a modified landing pattern allows the placement of the connector directly on top of the line traces on the PC board with minimal interference to the routing of the line traces.

FIG. 4A illustrates an exemplary route-through connector footprint 400. Implemented signal pads 402 correspond to a subset of the standard connector signal pads illustrated in FIG. 3A. However, signal pads 402 are elongated outward slightly to provide for easier hand soldering of a connector on the PC board. As illustrated, signal pads 4, 5, 8, 11, 14, 15, 20, 22 and 23 are not implemented. Note that footprint 400 is merely exemplary and any combination of signal pads can be implemented or not per application. A silkscreen 404 can be drawn on a PC board to allow for easier placement when a connector is populated.

Route-through connector footprint 400 allows the option to omit populating the connector at assembly, and if the connector is needed, to later hand solder the connectors to route-through connector footprint 400. Additionally, a pick and place pad can be included on the PC board if a connector is to be placed during board assembly.

Implemented signal pads 402 are spaced so as to become part of corresponding line traces. Route-through connector footprint 400 and the pin-pitch of the connector is such that each line trace can pass through the connector landing without deviating from normal routing paths while adhering to routing restrictions.

FIG. 4B illustrates an exemplary differential pair signaling route-through connector footprint 450. Implemented signal pads 452 correspond to a subset of the standard connector signal pads illustrated in FIG. 3B. However, signal pads 452 are elongated outward slightly to provide for easier hand soldering of a connector on the PC board. As illustrated, signal pads 6, 8, 9, 11, 14, 16, 17, 19, 22, 24, 25, 27, 30, 32, 33, 35, 38 and 40 are not implemented. Note that footprint 450 is merely exemplary and any combination of signal pads can be implemented or not per application. A silkscreen 454 can be drawn on a PC board to allow for easier placement when a connector is populated.

As illustrated in FIG. 3B, connector footprint 350 includes the placement of a center conductor consisting of four ground pads 358 for ground connection. However, full implementation of ground pads 358 does not allow line traces to pass through connector footprint 350. Thus, to form route-through connector footprint 450, only two ground pads 458 are implemented as shown improving electrical and mechanical reliability. Ground pads 458 are elongated outward without impeding the routing of the line trace signaling. The sizes of ground pads 458 can be determined after routing is completed.

The small pitch of the signal pads 452 of route-through connector footprint 450 allows adherence to differential pair routing rules for line trace spacing and length matching, for example, as specified in the HyperTransport link layout guidelines. Thus, a standard connector can be utilized without significantly degrading the differential pair signal quality.

Figure 5A:
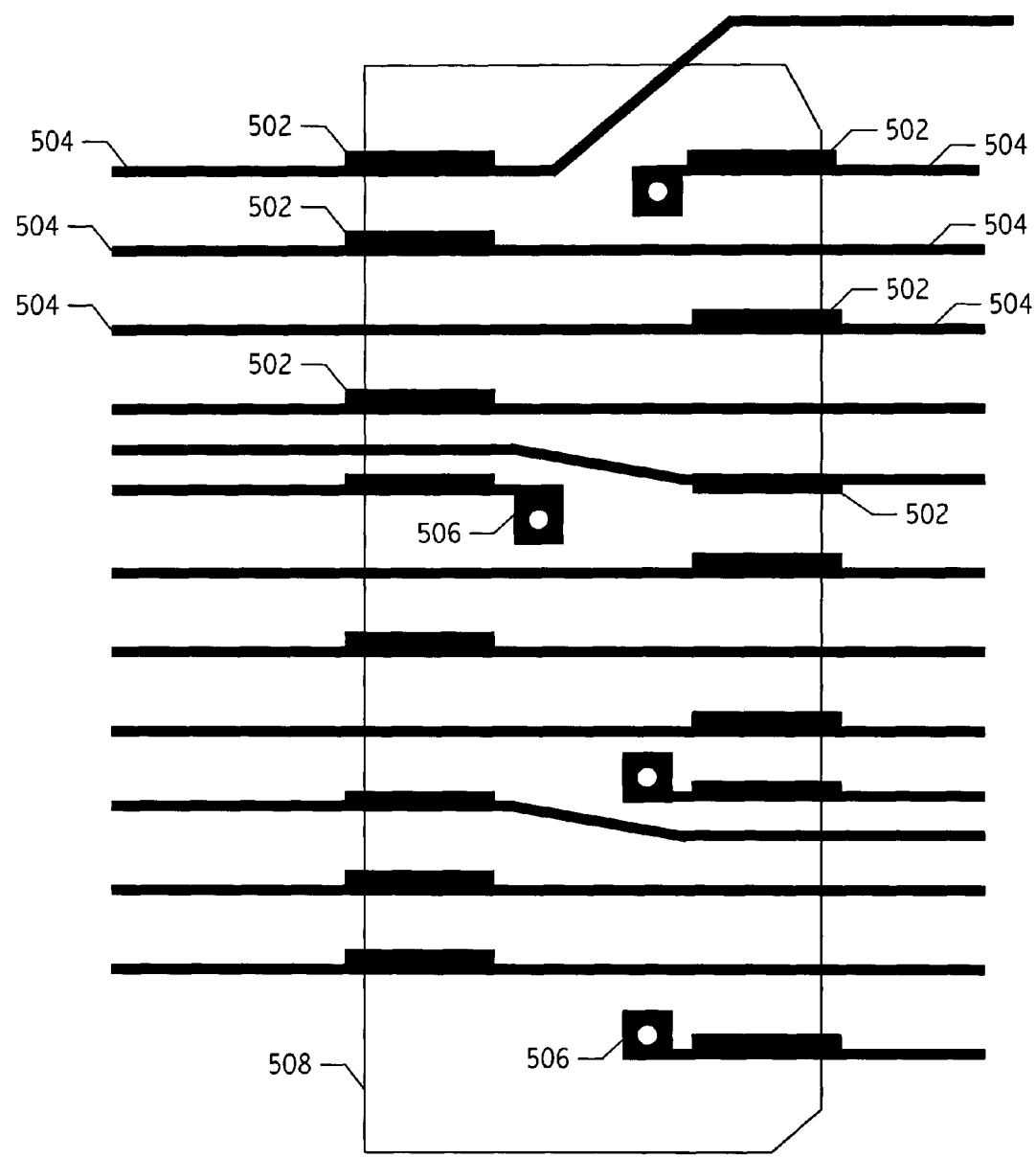
FIG. 5A-5B illustrate exemplary line trace routing according to some embodiments of the present invention.
Figure 5B:
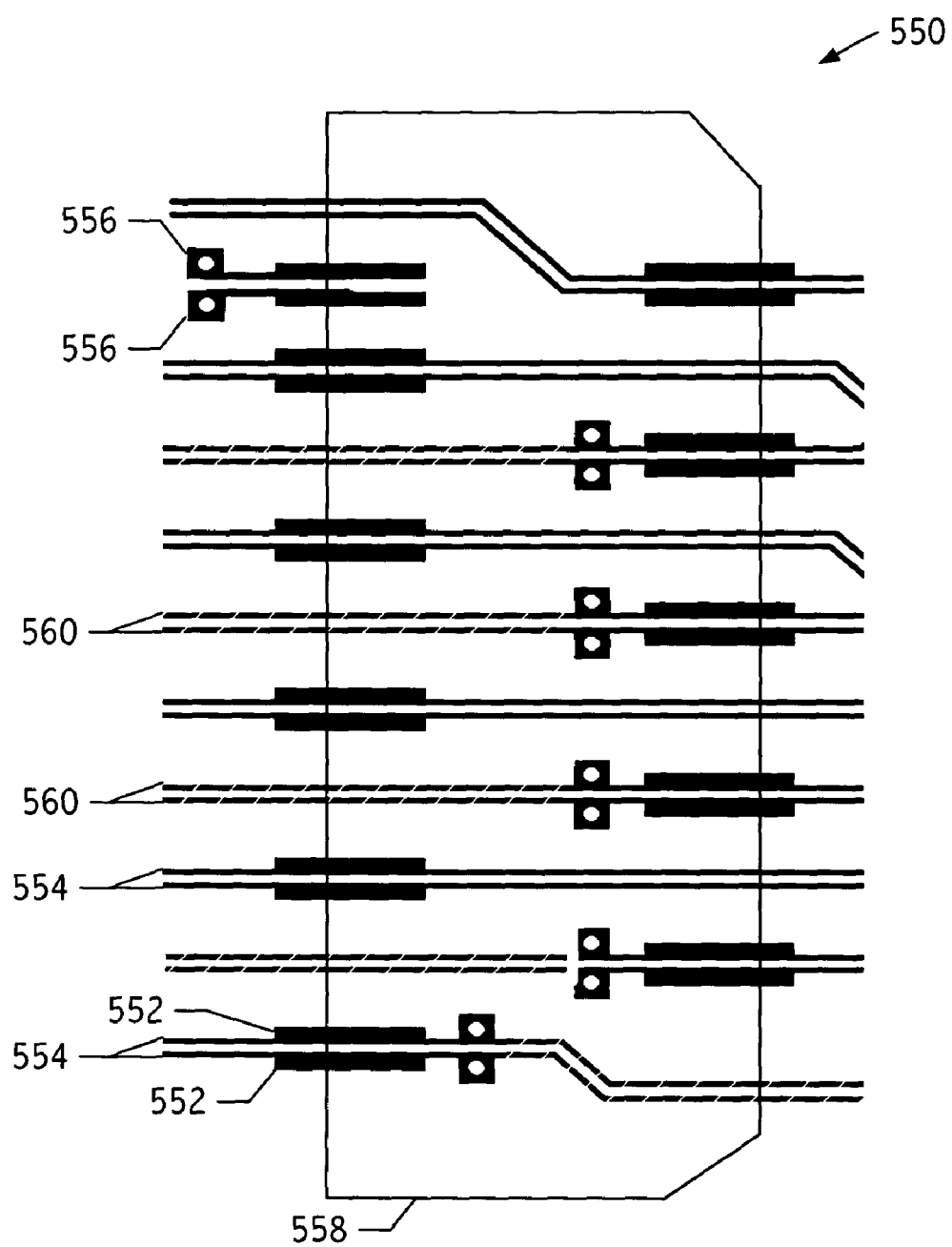

FIGS. 5A-5B illustrate exemplary line trace routings according to some embodiments of the present invention. A route-through connector footprint allows placement of a connector directly atop PC board line traces. The line traces can be routed as normal without special allowances or variations for a connector. Signal pads for the connector are implemented adjacent to (as shown) or inline with and electrically connected to the line traces. This routing and pad placement maintains differential pair routing rules and fits into a small area, saving board space. Route-through connector footprints allow trace length matching to the connectors to be met with minimal interference to line trace routes.

Referring to FIG. 5A, signal pads 502 forming a route-through connector footprint are adjacent to and electrically connected to line traces 504. Vias 506 are utilized to route line traces to another layer of a PC board. A silkscreen 508 can be drawn on a PC board to aid in connector orientation and placement.

Referring to FIG. 5B, signal pads 552 forming a differential pair signaling route-through connector footprint are adjacent to and electrically connected to line traces 554. Vias 556 are utilized to route line traces to another layer of a PC board. A silkscreen 558 can be drawn on a PC board to aid in connector orientation and placement. Line traces 560 illustrate line traces on another layer of the PC board, for example, a lower layer or opposite layer side of the PC board.

Although a PC board can have up to 24 or more layers, utilizing a route-through connector footprint, the number of layers can be as low as 4 layers. Vias are used to transfer a line trace from one layer to another. In order to route signals from the opposite side of the board to the side which the connector is placed, in-line vias are added to the traces. A via size of 10 mils or smaller is suggested to minimize capacitive load on, for example, differential pair signaling. Additionally, square pads for the vias can be implemented to allow for a cleaner connection to the line trace and to help minimize trace lengths and eliminate varying from the differential-pair spacing requirement for differential pair signaling.

Silkscreens 508 and 558 provide an outline of each connector indicating the orientation of the corner-cuts as well as a description of the probe connector pin-out implemented. Creating the silkscreen with the corner-cut outlines can aid in the population of the connector after assembly. In addition, silkscreens 508 and 558 can include standard silkscreen items such as a reference designator (RefDes) number and a pin 1 indicator. Each component placed on a printed circuit board can have an alpha numeric reference designator silk-screened next to the component which can be used to reference the design schematic.

Figure 6:
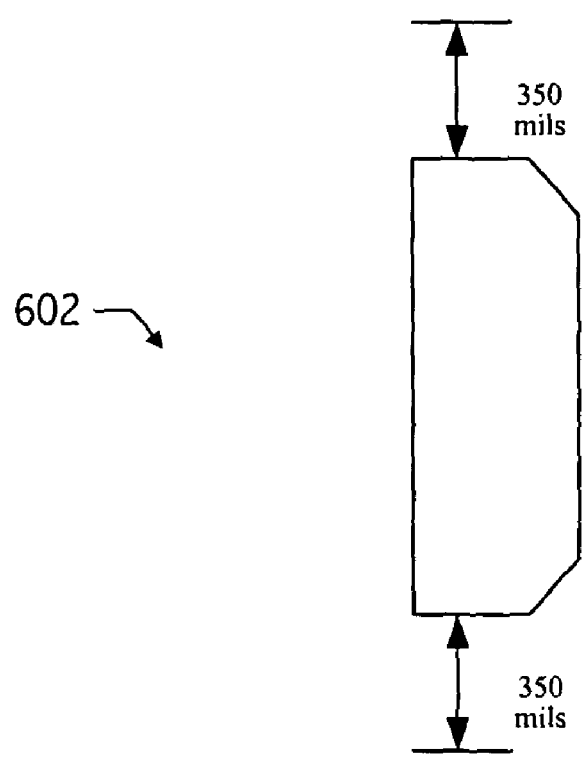
FIG. 6 illustrates an exemplary connector clearance according to an embodiment of the present invention.

FIG. 6 illustrates an exemplary connector clearance according to an embodiment of the present invention. A keep out restriction ensures that components are not within a certain space, for example, 350 mils, of the connector as shown on the y-axis. There is no keep-out restriction in the x-axis or the z-axis. The clearance is defined according to the probe used. For example, if no clearance is provided, other components on the printed circuit board could interfere with the attachment of the probe to the connector.

The route-through connector footprint provides a technique for observing signaling on the line traces between ICs on a PC board traces without introducing significant signal degradation. The route-through connector footprint allows the use of a standard connector without the use of stub traces. The route-through connector footprint allows a standard connector to be introduced directly into the line traces routed between ICs. Because stub traces are not used, this technique for mechanical interconnection into the line traces on a PC board allows for a single board layout to be used for both test and production. Additionally, because stub traces are not used, signal quality is minimally impacted and testing can be performed at operational speeds improving the reliability of the test function. Additionally, the use of a route-through connector footprint saves PC board space and cost.

The route-through connector footprint can be used for logic analysis during system debug. Additionally, the route-through connector footprint can save PC board space and cost when used for interconnection between ICs on multiple PC boards.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. An apparatus for analyzing a system comprising:
   routing means for coupling two integrated circuits;
   means for coupling a connector to the routing means;
   wherein the means for coupling forms a route-through connector footprint; and
   wherein the connector footprint is configured to allow at least a portion of the routing means to be routed continuously through the connector footprint.

2. The apparatus as recited in claim 1, wherein the means for coupling includes individual signal pads and at least one of the signal pads is elongated.

3. The apparatus as recited in claim 1, wherein the connector is a standard connector having a plurality of leads and wherein less than all of the plurality of leads are connected to the means for coupling.

4. The apparatus as recited in claim 1, wherein signaling on the routing means is differential pair signaling.

5. The apparatus as recited in claim 1, wherein the routing means conforms to differential signaling routing restrictions.

6. The apparatus as recited in claim 1, wherein the route-through connector footprint is compatible with a logic analyzer connector.

7. The apparatus as recited in claim 1, wherein the means for coupling includes individual signal pads and the routing means includes a plurality of line traces and wherein the individual signal pads are adjacent to corresponding ones of the plurality of line traces and wherein the individual signal pads are in a plane including the corresponding adjacent line traces.

8. The apparatus as recited in claim 1, further comprising:
   the connector coupled to the routing means.

9. The printed circuit board as recited in claim 1, wherein the routing means is continuously routed on the printed circuit board and through the connector footprint.

10. A printed circuit board comprising:
    plurality of line traces configured to route between two integrated circuits; and
    signal pads, individual ones of the signal pads being electrically connected to individual ones of the plurality of line traces;
    wherein the signal pads form a route-through connector footprint, wherein the route-through connector footprint is compatible with a logic analyzer connector.

11. The printed circuit board as recited in claim 10, wherein at least one of the signal pads is elongated.

12. The printed circuit board as recited in claim 10, wherein signaling on the plurality of line traces is observable at operational speeds through a connector attached to the signal pads.

13. The printed circuit board as recited in claim 10, wherein the route-through connector footprint is configured to receive a standard connector having a plurality of leads by connecting less than all of the plurality of leads to the signal pads.

14. The printed circuit board as recited in claim 10, wherein signaling on the plurality of line traces is differential pair signaling.

15. The printed circuit board as recited in claim 10, wherein a routing of the plurality of line traces conforms to differential signaling routing restrictions.

16. The printed circuit board as recited in claim 10, wherein individual signal pads are adjacent to corresponding ones of the plurality of line traces and wherein the individual signal pads are in a plane including the corresponding adjacent line traces.

17. The printed circuit board as recited in claim 10, wherein at least one of the plurality of line traces is an electrical short between the integrated circuits.

18. The printed circuit board as recited in claim 10, wherein at least one of the plurality of line traces passes continuously through the connector footprint.

19. The printed circuit board as recited in claim 10, wherein at least one of the plurality of line traces directly couples the two integrated circuits through a continuous, conductive path on the printed circuit board.

20. The printed circuit board as recited in claim 12, wherein the signal pads are elongated.

21. The printed circuit board as recited in claim 17, wherein the route-through connector footprint is configured to allow at least one of the plurality of line traces to be routed to another layer of the printed circuit board underneath the connector footprint.

22. The printed circuit board as recited in claim 20, wherein the route-through connector footprint is configured to receive a standard connector having a plurality of leads and configured to connect less than all of the plurality of leads to the signal pads.

23. The printed circuit board as recited in claim 22, further comprising a connector attached to the signal pads for the observation of signaling on the plurality of line traces.

24. The printed circuit board as recited in claim 23, wherein the route-through connector footprint is configured to route the plurality of line traces underneath the connector.

* * * * *